(12) United States Patent
Naito (10) Patent No.: US 11,013,145 B1
(45) Date of Patent: May 18, 2021

(54) VAPOR CHAMBER

(71) Applicant: Murata Manufacturing Co., Ltd., Nagaokakyo (JP)

(72) Inventor: Akihito Naito, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 16/874,853

(22) Filed: May 15, 2020

(51) Int. Cl.
  *H05K 7/20* (2006.01)
  *F28D 15/04* (2006.01)
  *F28D 15/02* (2006.01)

(52) U.S. Cl.
  CPC ....... *H05K 7/20309* (2013.01); *F28D 15/046* (2013.01); *H05K 7/2099* (2013.01); *F28D 15/0233* (2013.01); *H05K 7/20336* (2013.01)

(58) Field of Classification Search
  CPC ............. H05K 7/2029; H05K 7/20309; H05K 7/20318; H05K 7/20336; F28D 15/046
  See application file for complete search history.

(56) References Cited

U.S. PATENT DOCUMENTS

| | | |
|---|---|---|
| 3,971,435 A | 7/1976 | Peck |
| 7,775,261 B2 | 8/2010 | Valenzuela |
| 9,835,383 B1 | 12/2017 | Roper et al. |
| 2007/0056711 A1 | 3/2007 | Ohsawa |
| 2009/0323285 A1 | 12/2009 | Ryoson et al. |
| 2010/0326632 A1 | 12/2010 | Nagai et al. |
| 2013/0269913 A1 | 10/2013 | Ueda et al. |
| 2019/0141855 A1 | 5/2019 | Inagaki et al. |
| 2019/0239395 A1 | 8/2019 | Joshi et al. |
| 2019/0285357 A1 | 9/2019 | Sheng |
| 2020/0045851 A1 | 2/2020 | Hsieh |
| 2020/0103176 A1 | 4/2020 | Ben-Menahem et al. |

FOREIGN PATENT DOCUMENTS

JP  2019020001 A  2/2019

*Primary Examiner* — Zachary Pape
(74) *Attorney, Agent, or Firm* — Arent Fox LLP (57) ABSTRACT

The vapor chamber includes a casing, a working fluid, a microchannel, and a wick. The casing includes an upper casing sheet and a lower casing sheet that face each other and are joined together at an outer edge so as to define an internal space therebetween. The microchannel is in the lower casing sheet and in communication with the internal space so as to form a flow path for the working fluid. The wick is in the internal space of the casing, and is in contact with the microchannel. The microchannel has a plurality of convexes that form the flow path, an area ratio of an area of the plurality of convexes to an entire area of the microchannel is 5% to 40% in a plan view of the vapor chamber, and a height of the plurality of convexes is 5 to 50 μm.

16 Claims, 10 Drawing Sheets

VAPOR CHAMBER

BACKGROUND OF THE INVENTION

Field of the Invention

The present invention relates to a vapor chamber.

Description of the Related Art

Japanese Patent Application Laid-Open No. 2019-20001 discloses a vapor chamber that includes an upper casing sheet 6 having a column 3, a lower casing sheet 7 having a protrusion 5, and a wick 4 disposed in a sealed space between the upper casing sheet 6 and the lower casing sheet 7 and sandwiched between the protrusion 5 and the column 3. The upper casing sheet 6 and the lower casing sheet 7 seal a working fluid such as water in an internal space therebetween.

The working fluid is vaporized by heat from a heat source, moves in the internal space, and then releases heat to the outside to return to a liquid state. The working fluid that has returned to the liquid state moves between the columns 3 by a capillary force of the wick 4, returns to the vicinity of the heat source again, and evaporates again. Accordingly, the vapor chamber can diffuse heat at high speed by using the latent heat of evaporation and the latent heat of condensation of the working fluid without requiring external power.

SUMMARY OF THE INVENTION

A wick has a plurality of holes. A working fluid is activated by a capillary force according to these plurality of holes. However, when an area of an opening of a microchannel is too large, the wick sinks into an opening portion of the microchannel, and a gas-liquid interface of the working fluid is not formed at the holes of the wick. On the other hand, if the area of the opening of the microchannel is too small, a transmission sectional area of the working fluid becomes small, and the maximum heat transport amount decreases. When a height of a convex of the microchannel is too low, the transmission sectional area of the working fluid becomes small, and the maximum heat transport amount decreases. On the other hand, if the height of the convex of the microchannel is too high, a distance from a heat source to the wick becomes lengthy, so that heat becomes less likely to be transmitted from the heat source.

Thus, one embodiment of the present invention relates to a vapor chamber designed to prevent sinking of a wick while ensuring heat conduction and a transmission sectional area of a working fluid.

The vapor chamber according to one embodiment of the present invention has the following configuration in order to solve this problem.

The vapor chamber includes a casing, a working fluid, a microchannel, and a wick. The casing includes an upper casing sheet and a lower casing sheet that face each other and are joined together at an outer edge so as to define an internal space therebetween. The working fluid is sealed in the internal space. The microchannel is in the lower casing sheet and in communication with the internal space so as to form a flow path for the working fluid. The wick is in the internal space of the casing, and is in contact with the microchannel. The microchannel has a plurality of convexes that form the flow path, an area ratio of an area of the plurality of convexes to an entire area of the microchannel is 5% to 40% in a plan view of the vapor chamber, and a height of the plurality of convexes is 5 to 50 μm.

DETAILED DESCRIPTION OF THE INVENTION

Figure 1:
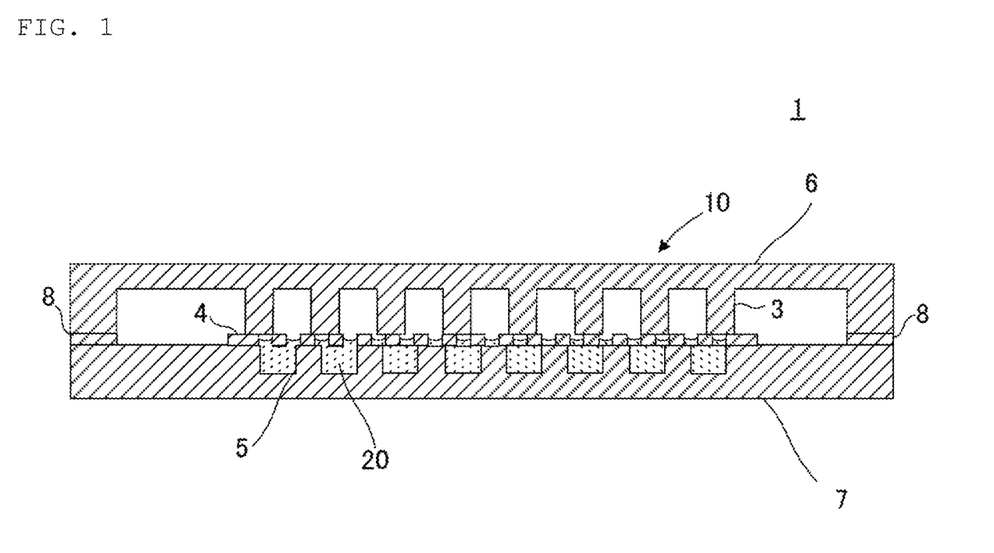
FIG. 1 is a sectional view of a vapor chamber 1 according to one embodiment of the present invention.
Figure 2:
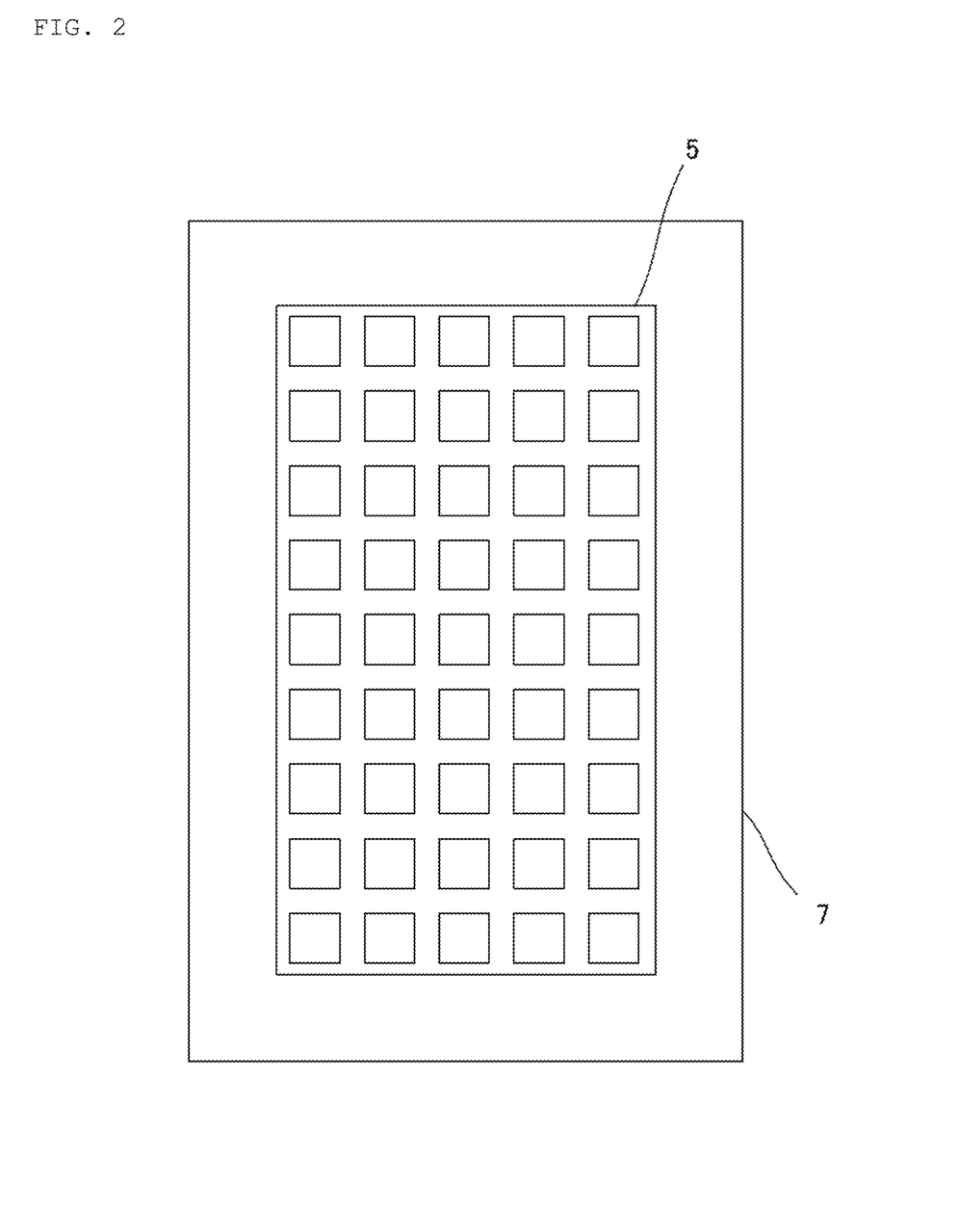
FIG. 2 is a plan view of a lower casing sheet 7.
Figure 3:
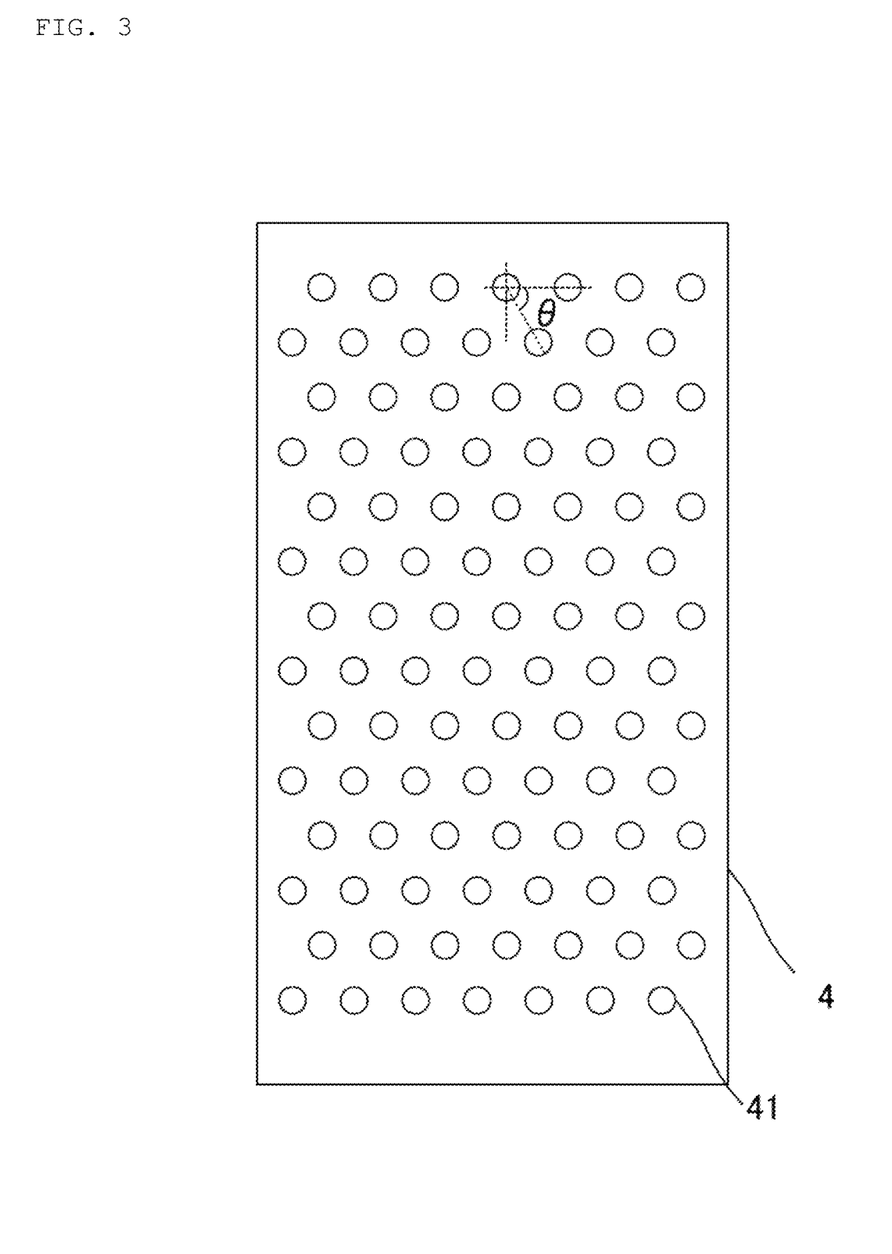
FIG. 3 is a plan view of a wick 4.

FIG. 1 is a sectional view of a vapor chamber 1 according to one embodiment of the present invention. FIG. 2 is a plan view of a lower casing sheet 7. FIG. 3 is a plan view of a wick 4. All the drawings of the present embodiment are schematically shown for ease of explanation, and are not drawn to scale or otherwise show the actual size of the components depicted therein.

The vapor chamber 1 includes a flat casing 10. The casing 10 has an upper casing sheet 6, the lower casing sheet 7, and a joining member 8. The upper casing sheet 6 and the lower casing sheet 7 are joined together at an outer edge by the joining member 8. As shown in the plan view of FIG. 4, the joining member 8 is disposed outside a broken line shown at the outer edge of the lower casing sheet 7. The joining member 8 is formed of, for example, a phosphor copper brazing filler.

The casing 10 has an internal space between the upper casing sheet 6 and the lower casing sheet 7. A working fluid 20 such as water is sealed in the internal space. The upper casing sheet 6 has a support 3 disposed in the internal space. The lower casing sheet 7 has a microchannel 5 disposed in the internal space.

The upper casing sheet 6 and the lower casing sheet 7 are formed of copper, nickel, aluminum, magnesium, titanium, iron, or an alloy mainly composed of these metals (for example, a nickel copper alloy or phosphor bronze), for example, and have a high thermal conductivity. In the present embodiment, the upper casing sheet 6 and the lower casing sheet 7 are rectangular in a plan view of the vapor chamber. However, the upper casing sheet 6 and the lower casing sheet 7 may be polygonal or circular in the plan view. The shape of the internal space may be any shape.

As shown in FIG. 2, the microchannel 5 is a concavoconvex shaped portion having a plurality of prism-shaped convexes. The concavoconvexes of the microchannel 5 are formed, for example, by etching an upper surface of the lower casing sheet 7. However, the concavoconvex shape of the microchannel 5 is not limited to a prism. The concavoconvex shape of the microchannel 5 may be, for example, a column.

When the concavoconvexes of the microchannel 5 are formed by etching, the concavoconvex shape of the microchannel 5 is typically a truncated pyramid shape. The concavoconvexes of the microchannel 5 may be arranged in a lattice, may be arranged in a honeycomb pattern, or may be randomly arranged.

The support 3 is a column for maintaining the thin plate shape of the vapor chamber 1. The support 3 is formed by etching a portion of the upper casing sheet 6 other than the support 3. The support 3 preferably has a prism shape. However, the shape of the support 3 is not limited to a prism. The shape of the support 3 may be, for example, a column. A sectional area of the support 3 is larger than a sectional area of the convex of the microchannel 5, and an interval between the adjacent supports 3 is larger than a pitch of the convexes of the microchannel 5.

The wick 4 is disposed in the internal space so as to be sandwiched between the lower casing sheet 7 and the support 3. The wick 4 is formed of a metal material thinner than the upper casing sheet 6 and the lower casing sheet 7. The wick 4 is preferably adhesive bonded (diffusion bonded) to the microchannel 5 of the lower casing sheet 7. The wick 4 may be formed of the same material as or different materials from the upper casing sheet 6 and the lower casing sheet 7. As shown in FIG. 3, the wick 4 is rectangular in the plan view. However, the wick 4 may be polygonal or circular in the plan view. The shape of the wick 4 is appropriately set according to the shape of the internal space.

The wick 4 has a plurality of holes 41. The holes 41 are formed by, for example, etching. In the example of FIG. 3, the holes 41 are circular but may be rectangular. However, when the holes 41 are circular, a gas-liquid interface becomes spherical, and the working fluid 20 can be uniformly evaporated.

The holes 41 are preferably arranged in a honeycomb pattern. In the example of FIG. 3, an angle θ formed between any given hole 41 and two adjacent holes 41 is 60°. However, θ may be, for example, 45°. The holes 41 may be arranged in a lattice. Of course, the holes 41 may be arranged irregularly. The working fluid 20 changes from a liquid to a gas in the holes 41 due to heat from a heat source close contact with the lower casing sheet 7. That is, the working fluid 20 forms the gas-liquid interface in the holes 41. The vaporized working fluid 20 emits heat in the internal space of the casing 10 and returns to a liquid state. The working fluid 20 that has returned to the liquid state moves through the microchannel 5 due to a capillary force from the hole 41 of the wick 4 and is transported again near the heat source. Accordingly, the vapor chamber 1 can diffuse heat at high speed by using the latent heat of evaporation and the latent heat of condensation of the working fluid 20 without requiring external power.

In the vapor chamber 1 of the present embodiment, a strong capillary force is secured by the holes 41 of the wick 4 having a relatively small opening area, and a transmission sectional area of the working fluid 20 (transmission amount of the working fluid 20) is secured by the microchannel 5 having a relatively large opening area.

The vapor chamber 1 of the present embodiment has the following features.

(1) In the plan view, an area of the wick 4 is larger than an area of a region corresponding to the microchannel 5.

Figure 4:
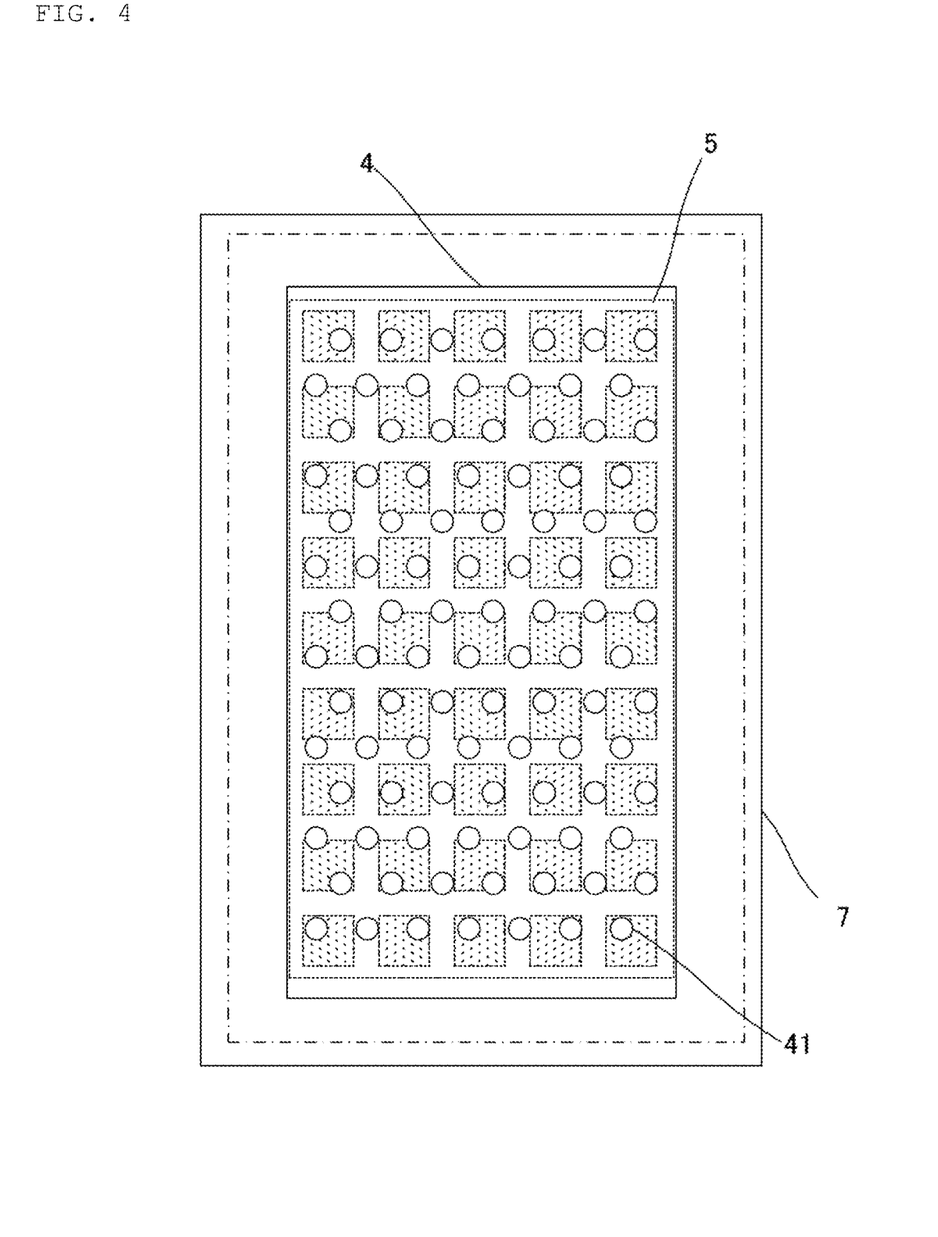
FIG. 4 is a plan view in which the lower casing sheet 7 and the wick 4 are overlapped through a portion of the wick 4.

FIG. 4 is a plan view in which the lower casing sheet 7 and the wick 4 are overlapped through a portion of the wick 4. The wick 4 is wider in the plan view than the width of the microchannel 5. The wick 4 is sandwiched between the lower casing sheet 7 and the support 3, but may be shifted in a plane direction of the casing sheet 7. However, the wick 4 is wider in the plan view than the area of the region corresponding to the microchannel 5. Preferably, the entire area of the wick 4 is larger than the entire area of the microchannel 5. Accordingly, even if the wick 4 is shifted in the plane direction, a possibility that the wick 4 comes out of the region where the microchannel 5 is disposed is reduced.

Figure 5:
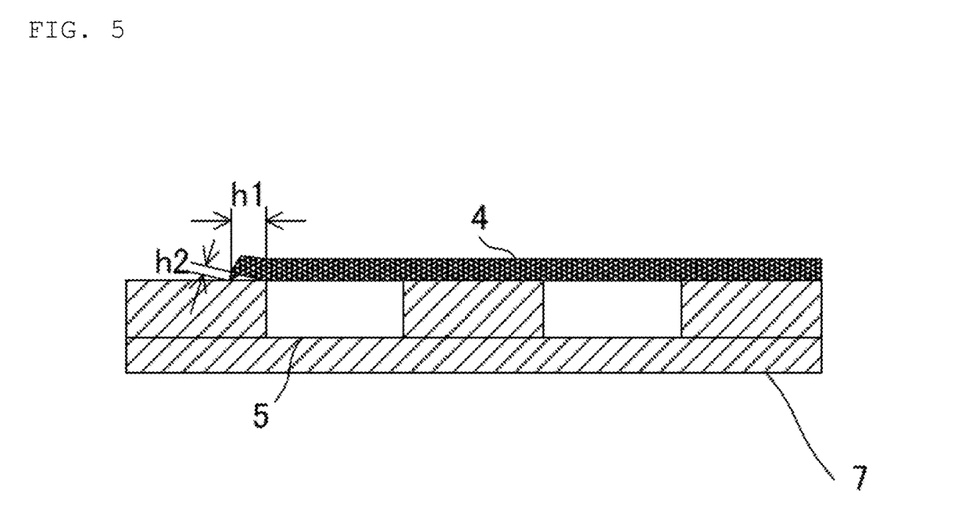
FIG. 5 is an enlarged sectional view of the vapor chamber 1.

The wick 4 is formed by being cut out from one mother sheet, such as a copper plate. In the wick 4, a burr may be formed at a peripheral edge in a cutting step. Accordingly, as shown in FIG. 5, the peripheral edge of the wick 4 may be separated and floated from the lower casing sheet 7 by the burr. When the wick 4 separates from the lower casing sheet 7, the heat from the heat source becomes less likely to be transmitted to the wick 4. However, since the wick 4 is wider in the plan view than the area of the region corresponding to the microchannel 5, even if the peripheral edge is floated, floating from the lower casing sheet 7 can be suppressed in the region corresponding to the microchannel 5. Accordingly, the wick 4 can ensure suitable heat conduction from the microchannel 5.

A length h1 from a peripheral edge of the microchannel 5 to peripheral edge of the wick 4 is preferably not less than a height h2 of the burr. If h1 h2, even if the peripheral edge of the wick 4 is floated, an area of floating from the lower casing sheet 7 can be sufficiently suppressed in the region where the microchannel 5 is disposed, and suitable heat conduction can be ensured.

(2) A contact area between the wick 4 and the microchannel 5 is 5% to 40% with respect to an area of the internal space taken as a plane. The contact area between the wick 4 and the microchannel 5 is more preferably 10% to 20% with respect to the area of the internal space taken as a plane.

In FIG. 4, the convexes of the microchannel 5 in contact with the wick 4 are indicated by hatching. The area of the internal space taken as a plane is an area of an inner region indicated by the dashed line in the figure. The outside of the dashed line is a portion joined by the joining member 8 and is not part of the area of the internal space taken as a plane.

In the vapor chamber 1, when the contact area between the wick 4 and the microchannel 5 is lower than 5% with respect to the area of the internal space taken as a plane, the amount of heat transmitted from the microchannel 5 to the wick 4 becomes low, and no gas-liquid interface can be formed at the hole 41 of the wick 4. In this case, the maximum heat transport amount decreases significantly. When the contact area between the wick 4 and the microchannel 5 exceeds 40% with respect to the area of the internal space taken as a plane, the amount of the working fluid 20 vaporized from the hole 41 of the wick 4 is not enough, and the maximum heat transport amount decreases significantly. Accordingly, when the contact area between the wick 4 and the microchannel 5 is 5% to 40% with respect to the area of the internal space taken as a plane, the vapor chamber 1 can ensure a predetermined maximum heat transport amount.

When the area of the wick 4 is larger than the area of the region corresponding to the microchannel 5 as in the above (1), the contact area includes an area where the wick 4 is in contact with the lower casing sheet 7, and is preferably 5% to 40% with respect to the area of the internal space taken as a plane.

Figure 6:
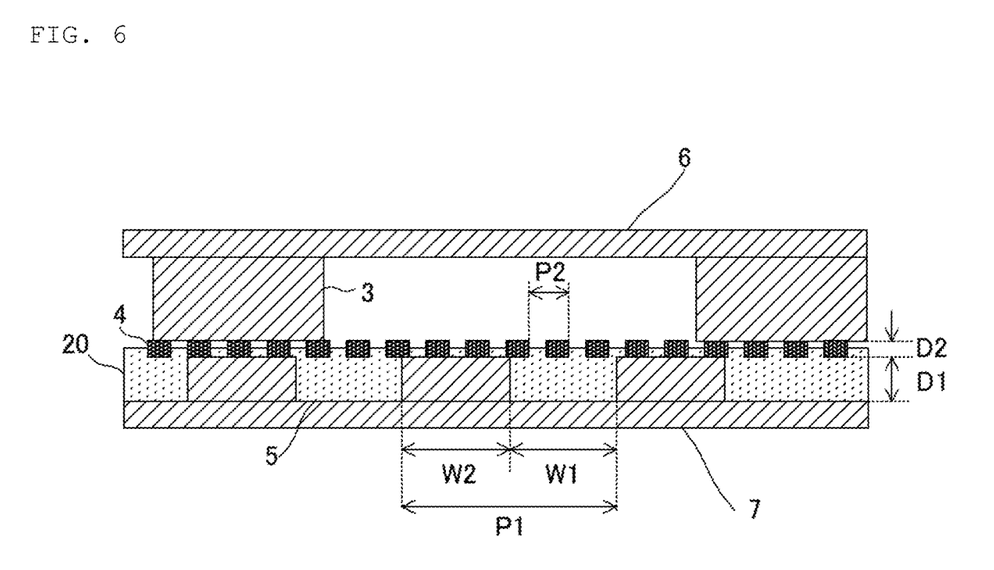
FIG. 6 is an enlarged partial sectional view of the vapor chamber 1.

(3) An opening width W1 of the microchannel 5 is preferably 50 to 200 μm, a thickness D2 of the wick 4 is preferably 5 to 35 μm, and preferably D2:W1=5:200 to 30:50.

More preferably, the thickness D2 of the wick 4 is 15 to 20 μm, and the opening width W1 of the microchannel 5 is 200 μm.

FIG. 6 is an enlarged partial sectional view of the vapor chamber 1. FIG. 6 shows a height D1 of the microchannel 5, the thickness D2 of the wick 4, the opening width W1 of the microchannel 5, a width W2 of the convex of the microchannel 5, an opening pitch P1 of the microchannel 5, and an opening pitch P2 of the wick 4.

When the thickness D2 of the wick 4 is small and the opening width W1 of the microchannel 5 is large, the wick 4 sinks into an opening portion of the microchannel 5, and a gas-liquid interface of the working fluid 20 is not formed at the holes 41 of the wick 4. Accordingly, the thickness D2 of the wick 4 is preferably 5 μm or more, and the opening width W1 is preferably 500 μm or less. On the other hand, if the thickness D2 of the wick 4 is too large, heat becomes less likely to be transmitted from the heat source in contact with the lower casing sheet 7. Accordingly, the thickness D2 of the wick 4 is preferably 35 μm or less. If the opening width W1 is too small, the transmission sectional area of the working fluid 20 decreases. Accordingly, the opening width W1 of the microchannel 5 is preferably 50 μm or more.

As the thickness D2 of the wick 4 increases, heat is less likely to be transmitted from the heat source. Therefore, it is necessary to reduce the opening width W1 to increase the contact area between the wick 4 and the microchannel 5, thereby ensuring heat conduction. According, in the vapor chamber 1, when D2:W1=5:200 to 30:50, a predetermined maximum heat transport amount can be ensured.

(4) In the plan view, an area ratio of the convexes of the microchannel 5 to the entire microchannel 5 is preferably 5% to 40%.

The working fluid 20 returns from a gas to a liquid and passes through an opening of the microchannel 5. Accordingly, the smaller the number of the convexes constituting a flow path of the working fluid 20 is, the larger the transmission sectional area of the working fluid 20 becomes. However, when an area of the opening of the microchannel 5 is too large, the wick 4 sinks into the opening portion of the microchannel 5, and the gas-liquid interface of the working fluid 20 is not formed at the holes 41 of the wick 4. Accordingly, in the plan view, a ratio of the area of the convexes to the entire microchannel 5 is preferably at least 5% or more.

On the other hand, if the area of the opening of the microchannel 5 is too small, the transmission sectional area of the working fluid 20 becomes small, and the maximum heat transport amount decreases. Accordingly, in the plan view, the ratio of the area of the convexes to the entire microchannel 5 is preferably at most 40% or less.

In the plan view, the ratio of the area of the convexes to the entire microchannel 5 is more preferably 18 to 30%.

(5) In the plan view, the area ratio of the convexes of the microchannel 5 to the entire microchannel 5 is preferably 5% to 40%, and the height D1 of the convex of the microchannel 5 is preferably 5 to 50 μm. However, when D1 is 50 μm, the area ratio is preferably 40%.

As described above, when the area of the opening of the microchannel 5 is too large, the wick 4 sinks into the opening portion of the microchannel 5, and the gas-liquid interface of the working fluid 20 is not formed at the holes 41 of the wick 4. On the other hand, if the area of the opening of the microchannel 5 is too small, the transmission sectional area of the working fluid 20 becomes small, and the maximum heat transport amount decreases.

When the height D1 of the convex of the microchannel 5 is too low, the transmission sectional area of the working fluid 20 becomes small, and the maximum heat transport amount decreases. On the other hand, if the height D1 of the convex of the microchannel 5 is too high, a distance from the heat source to the wick 4 becomes lengthy, so that heat becomes less likely to be transmitted from the heat source.

Thus, in the vapor chamber 1, in order to prevent sinking of the wick 4 while ensuring heat conduction and the transmission sectional area of the working fluid, in the plan view, the area ratio of the convexes of the microchannel 5 to the entire microchannel 5 is preferably 5% to 40%, and the height D1 of the convex of the microchannel 5 is preferably 5 to 50 μm. However, when D1 is 50 μm, since heat from the heat source is most difficult to be transmitted to the wick 4, the area ratio of the convexes is set to about 40%, which is the highest ratio, to ensure heat conduction.

(6) An opening ratio of the holes of the wick (the area of the holes 41 with respect to the entire area of the wick 4) is preferably 5 to 50%, the thickness D2 of the wick is preferably 5 to 35 μm, the sectional area of the convex of the microchannel 5 is preferably $(D1 \times W2)=150$ to 25000 μm², and the pitch P1 (W1+W2) of the convexes of the microchannel 5 is preferably 100 to 1000 μm. The pitch P1 is more preferably 100 to 500 μm.

If the thickness of the wick 4 is too large, heat becomes less likely to be transmitted from the heat source. On the other hand, if the thickness of the wick 4 is too thin, the wick 4 sinks into the opening portion of the microchannel 5. If the opening ratio of the wick 4 is too high, heat becomes less likely to be transmitted from the heat source. On the other hand, if the opening ratio of the wick 4 is too low, an evaporation amount of the working fluid 20 decreases, and the maximum heat transport amount decreases. However, when D2 is 35 μm, heat from the heat source is most difficult to be transmitted to the wick 4, so that the opening ratio is preferably set to about 5%, which is the lowest ratio, to ensure heat conduction.

When the sectional area of the convex of the microchannel 5 is too small and the pitch is too large, the wick 4 sinks into the opening portion of the microchannel 5. When the sectional area of the convex of the microchannel 5 is too large and the pitch is too small, the transmission sectional area of the working fluid 20 becomes small, and the maximum heat transport amount decreases.

Accordingly, in the vapor chamber 1, in order to prevent sinking of the wick 4 while ensuring heat conduction and the transmission sectional area of the working fluid, the opening ratio of the holes of the wick (the area of the holes 41 with respect to the entire area of the wick 4) is preferably 5 to 50%, the thickness D2 of the wick is preferably 5 to 35 μm, the sectional area of the convex of the microchannel 5 is preferably $(D1 \times W2)=150$ to 25000 μm², and the pitch P1 (W1+W2) of the convexes of the microchannel 5 is preferably 100 to 1000 μm.

Figure 7:
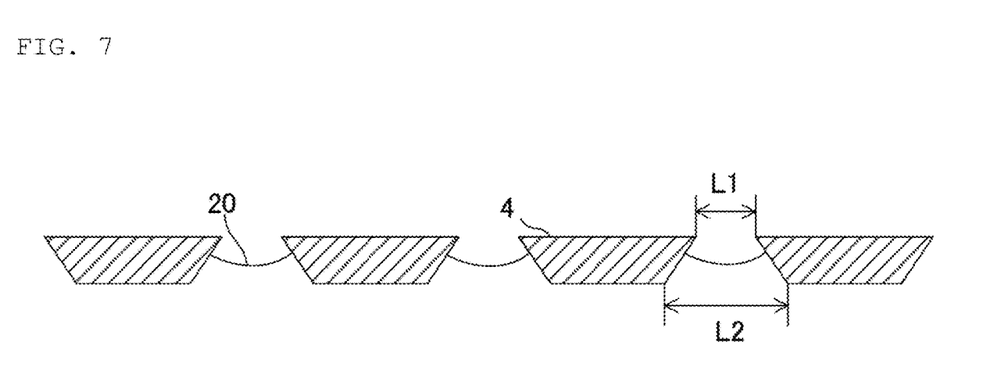
FIG. 7 is an enlarged sectional view of the wick 4.

(7) A ratio of an opening width L1 on a first surface (upper surface) side of the hole 41 of the wick 4 to an opening width L2 on a second surface (lower surface) side of the hole 41 of the wick 4 is preferably 1:3 to 1:1.

FIG. 7 is an enlarged sectional view of the wick 4. The holes 41 of the wick 4 are preferably formed by etching. When the etching is in an ideal state, the ratio of the opening width L1 on the upper surface side of the holes 41 of the wick 4 and the opening width L2 on the lower surface side is 1:1.

When a taper is formed during formation of the holes 41, or when the taper is intentionally generated, if the ratio of the opening width L1 on the upper surface side and the opening width L2 on the lower surface side is too large, the capillary force is reduced. Thus, in the vapor chamber 1, the ratio of the opening width L1 on the upper surface side and the opening width L2 on the lower surface side is preferably 1:3 or less.

In FIG. 7, as an example, L1=40 μm, and L2=55 μm. In addition, the following equations may be established that L1=30 μm and L2=100 μm. The following equations may be established that L1=40 μm and L2=40 μm.

In the example of FIG. 7, the side with the smaller diameter of the hole is disposed on the gas-liquid interface side which is the upper surface side, and the side with the larger diameter of the hole is disposed on the microchannel side which is the lower surface side. However, the side with the smaller diameter of the hole may be disposed on the lower surface side, and the side with the larger diameter of the hole may be disposed on the upper surface side.

Figure 8:
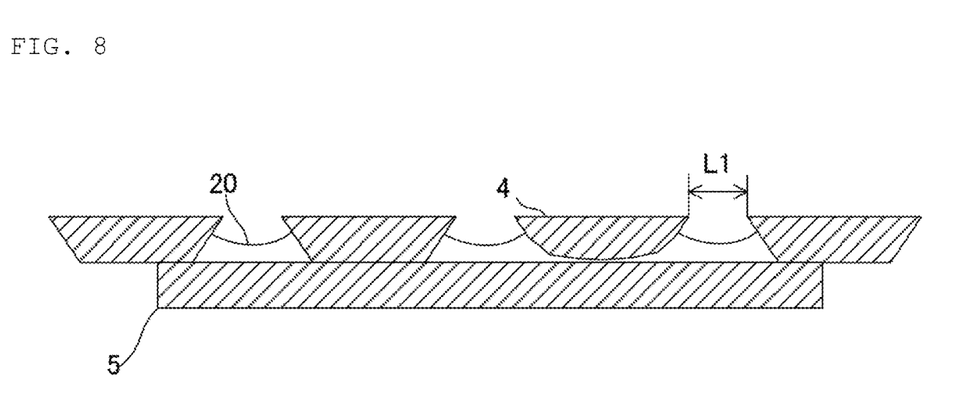
FIG. 8 is an enlarged sectional view of the wick 4.

In all the holes 41, the ratio of the opening width L1 on the upper surface side and the opening width L2 on the lower surface side does not need to be 1:3 to 1:1. The number of holes 41 satisfying the ratio may be 90% or more relative to the total number of the holes. As shown in FIG. 8, when the amount of etching increases, the lower surface side of the wick 4 is shaved, and a portion not being in contact with the microchannel 5 may be generated. In this case, although an amount of heat conduction is reduced in the portion not being in contact with the microchannel 5, the transmission amount of the working fluid 20 is improved because the working fluid 20 transmits within a gap between the wick 4 and the microchannel 5.

(8) A difference between a thickness of the joining member 8 and the thickness of the wick 4 is preferably 20 μm or less.

The difference between the thickness of the joining member 8 and the thickness of the wick 4 is more preferably 10 μm or less. For example, the thickness of the joining member 8 of the present embodiment is 25 μm, and the thickness of the wick 4 is 15 μm. Thereby, smoothness of the casing 10 is improved. Accordingly, a sealing performance by the joining member 8 is improved. The joining member 8 has an inlet (not shown) for injecting the working fluid 20. When a vertical position of the inlet is about the same as the position of the wick 4, the vapor chamber 1 can inject the working fluid 20 from the inlet directly into the wick 4, and the working fluid 20 can be easily injected.

(9) The pitch P1 of the convexes of the microchannel 5 and a pitch P2 of the holes 41 of the wick 4 are not integral multiples.

For example, the pitch P1=350 μm, and the pitch P2=60 μm. In this case, an end of the hole 41 and an end of the convex are less likely to overlap in the plan view. Accordingly, the wick 4 becomes less likely to sink into the opening of the microchannel 5.

(10) The wick 4 preferably has a region where the holes 41 are not formed in the plan view, a width W3 of a portion constituting this region is 0.1 to 10 mm, and an area of this region is 90% or less of the area of wick 4 in the plan view.

When the portions constituting this region are regularly arranged, a pitch P3 is 0.1 to 10 mm.

Figure 9:
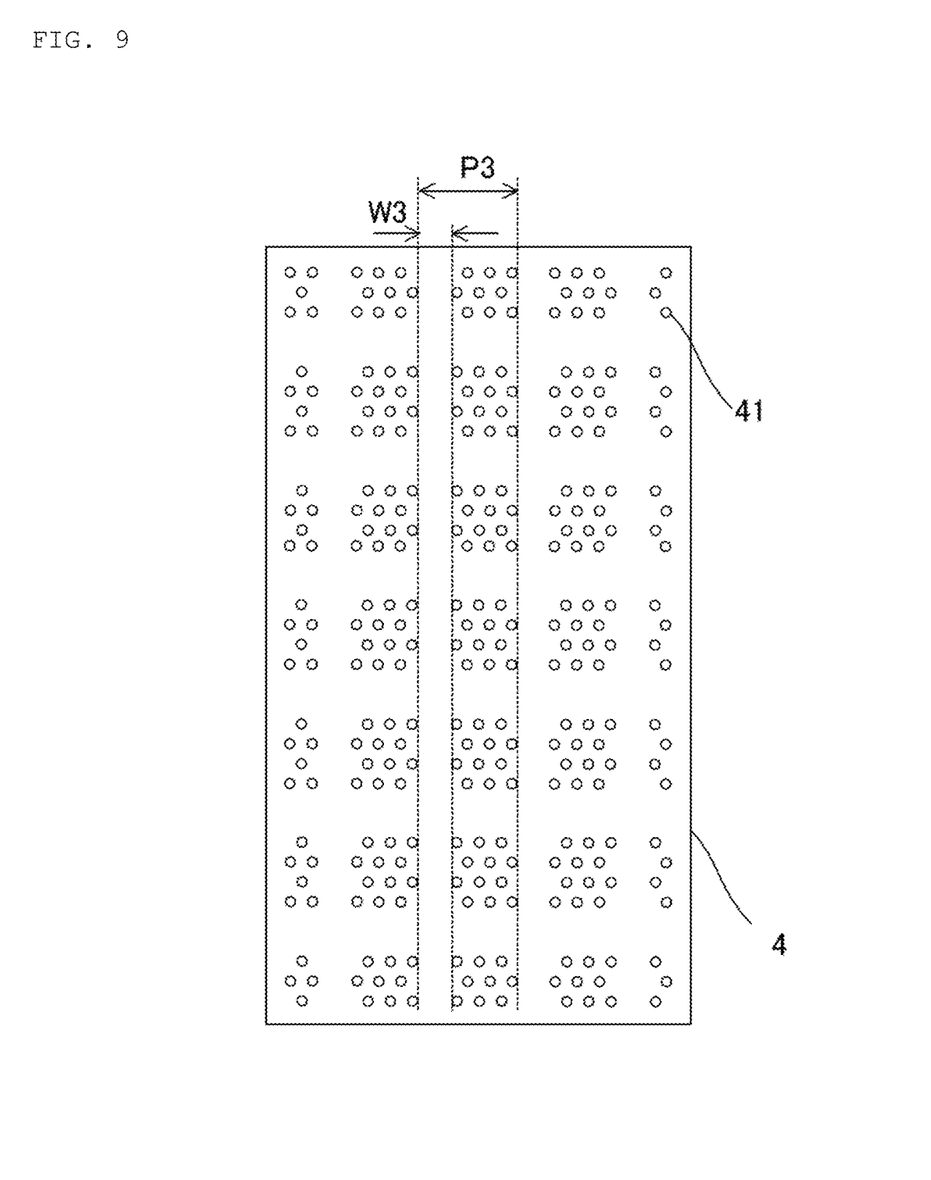
FIG. 9 is a plan view of a further configuration of the wick 4.

FIG. 9 is a plan view of a wick 4 having the region where the holes 41 are not formed. In FIG. 9, for the sake of explanation, the number of holes 41 greater in number than that in FIG. 3, and the holes 41 are smaller in size than that in FIG. 3. In this example, the region where the holes 41 are not formed are linear portions arranged in a lattice. The width W3 of each linear portion forming the lattice is 0.1 mm. The pitch P3 is 0.26 mm.

As described above, the wick 4 has the region where the holes 41 are not formed, the width W3 of the narrowest portion among the portions constituting the region is 0.1 to 10 mm, and the area of the region is 90% or less of the area of wick 4 in the plan view, so that adhesiveness to the microchannel 5 is improved, and the adhesive bonding is uniform. Accordingly, even if an impact such as a drop is applied to the vapor chamber 1 or a stress is generated at the time of bending, the wick 4 is less likely to lift from the microchannel 5. Thus, the vapor chamber 1 can suppress a change in the maximum heat transport amount.

Figure 10:
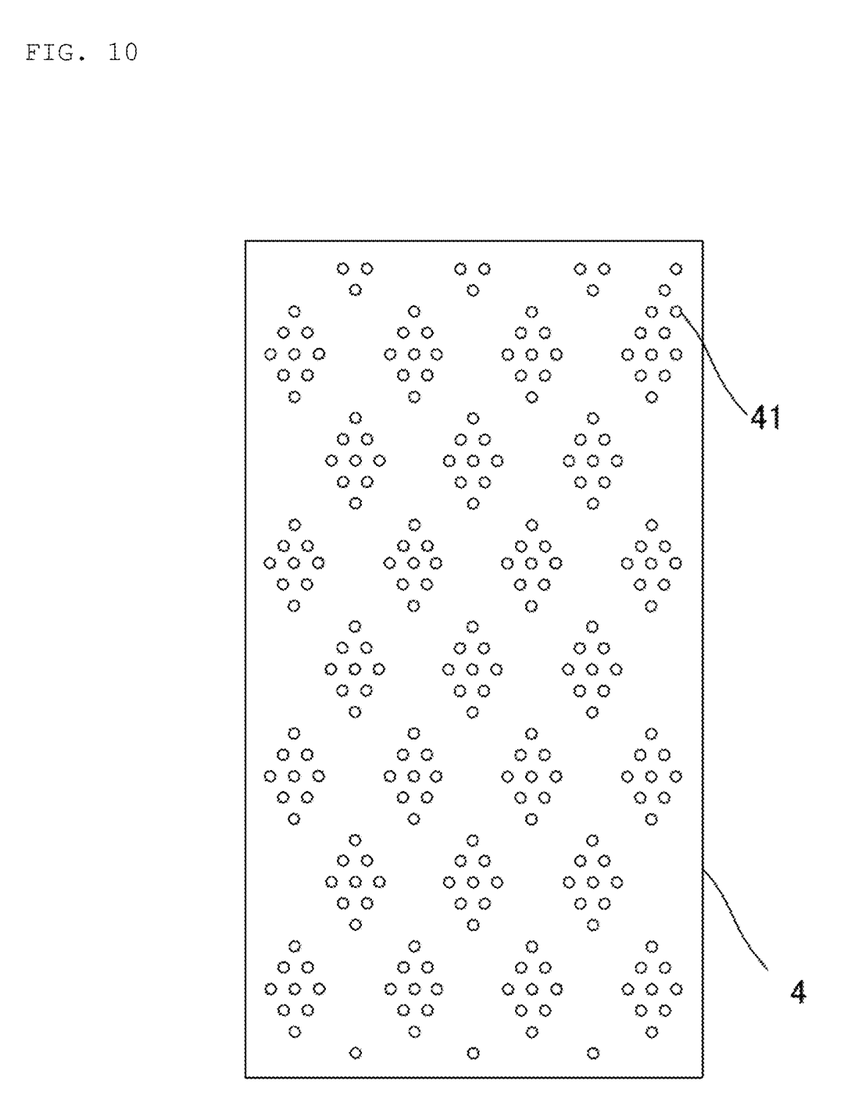
FIG. 10 is a plan view of yet another configuration of the wick 4.

The portion constituting this region is not limited to the example of FIG. 9. For example, as shown in FIG. 10, the portions constituting this region may be arranged diagonally. The portions constituting this region also need not be regularly arranged. The portions constituting the region may be randomly arranged in a random shape.

The description of the present embodiment is to be considered in all respects as illustrative and not limiting. The scope of the present invention is indicated not by the above embodiments but by the claims. The present invention includes all alterations within the implication and scope of the features described herein, and is to only be limited by the claims. For example, all or some the above-described features (1) to (10) may be combined.

What is claimed is:

1. A vapor chamber comprising:
    a casing including an upper casing sheet and a lower casing sheet that face each other and are joined together at an outer edge so as to define an internal space therebetween;
    a working fluid in the internal space;
    a microchannel in the lower casing sheet and in communication with the internal space so as to form a flow path for the working fluid; and
    a wick in the internal space of the casing and in contact with the microchannel,
    the microchannel having a plurality of convexes forming the flow path, an area ratio of an area of the plurality of convexes to an entire area of the microchannel is 5% to 40% in a plan view of the vapor chamber, and a height of the plurality of convexes is 5 to 50 μm.

2. The vapor chamber according to claim 1, wherein the height of the convex is 50 μm, and the area ratio is 40%.

3. The vapor chamber according to claim 1, further comprising a joining member that joins the upper casing sheet to the lower casing sheet at the outer edge.

4. The vapor chamber according to claim 3, wherein a difference between a thickness of the joining member and a thickness of the wick is 20 μm or less.

5. The vapor chamber according to claim 1, wherein a first pitch of the plurality of convexes of the microchannel and a second pitch of holes in the wick are not integral multiples.

6. The vapor chamber according to claim 1, further comprising a support in the upper casing sheet, the wick being between the support and the lower casing sheet.

7. The vapor chamber according to claim 1, wherein the wick is bonded to the microchannel.

8. The vapor chamber according to claim 1, wherein the wick includes a plurality of circular holes.

9. The vapor chamber according to claim 1, wherein an area of the wick is larger than an area of a region corresponding to the microchannel in a plan view of the vapor chamber.

10. The vapor chamber according to claim 1, wherein the wick is wider in a plan view of the vapor chamber than a width of the microchannel.

11. The vapor chamber according to claim 1, wherein the wick is a sheet-shaped wick.

12. The vapor chamber according to claim 1, wherein an opening width W1 of the microchannel is 50 to 200 μm, a thickness D2 of the wick is 5 to 35 μm, and D2:W1=5:200 to 30:50.

13. The vapor chamber according to claim 12, wherein the thickness D2 of the wick is 15 to 20 μm, and the opening width W1 of the microchannel is 200 μm.

14. The vapor chamber according to claim 1, wherein an opening ratio of an area of holes in the wick with respect to an entire area of the wick is 5 to 50%.

15. The vapor chamber according to claim 1, wherein a ratio of a first opening width on a first surface side of a hole in the wick to a second opening width on a second surface side of the hole in the wick is 1:3 to 1:1.

16. The vapor chamber according to claim 1, wherein the wick has a region where holes are not formed therein in a plan view of the vapor chamber, a width of a narrowest portion of the region is 0.1 to 10 mm, and an area of the region is 90% or less of an entire area of the wick in the plan view.

\* \* \* \* \*